United States Patent
Yang et al.

(10) Patent No.: US 10,153,017 B2
(45) Date of Patent: Dec. 11, 2018

(54) METHOD FOR SENSING MEMORY ELEMENT COUPLED TO SELECTOR DEVICE

(71) Applicant: Avalanche Technology, Inc., Fremont, CA (US)

(72) Inventors: Hongxin Yang, Newark, CA (US); Xiaobin Wang, Fremont, CA (US); Jing Zhang, Los Altos, CA (US); Xiaojie Hao, Fremont, CA (US); Zihui Wang, Milpitas, CA (US); Kimihiro Satoh, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 106 days.

(21) Appl. No.: 15/264,847

(22) Filed: Sep. 14, 2016

(65) Prior Publication Data
US 2018/0075891 A1    Mar. 15, 2018

(51) Int. Cl.
*G11C 11/16*    (2006.01)
*H01L 27/22*    (2006.01)
*H01L 43/02*    (2006.01)

(52) U.S. Cl.
CPC ........ *G11C 11/1673* (2013.01); *G11C 11/161* (2013.01); *G11C 11/1659* (2013.01); *H01L 27/224* (2013.01); *H01L 43/02* (2013.01)

(58) Field of Classification Search
CPC ... G11C 11/16; G11C 11/161; G11C 11/1659; G11C 11/1673
See application file for complete search history.

(56) References Cited

U.S. PATENT DOCUMENTS

| 7,935,952 | B2 | 5/2011 | Lee et al. |
| 8,637,342 | B2 | 1/2014 | Karpov et al. |
| 8,958,234 | B2 | 2/2015 | Nodin |
| 2010/0103728 | A1* | 4/2010 | Zhu ............... G11C 11/16 365/171 |
| 2014/0209892 | A1 | 7/2014 | Kuo et al. |
| 2014/0319634 | A1* | 10/2014 | Shukh ............. H01L 27/224 257/427 |
| 2016/0005461 | A1* | 1/2016 | Jo ................... G11C 29/026 365/148 |
| 2016/0020250 | A1 | 1/2016 | Li et al. |

* cited by examiner

*Primary Examiner* — Kretelia Graham
(74) *Attorney, Agent, or Firm* — Bing K. Yen (57) ABSTRACT

The present invention is directed to a method for sensing the resistance state of a memory cell that includes an MTJ memory element coupled to a two-terminal selector element in series. The method includes the steps of raising a cell voltage across the memory cell above a threshold voltage for the selector element to become conductive; decreasing the cell voltage to a first sensing voltage and measuring a first sensing current passing through the memory cell, the selector element being nominally conductive irrespective of the resistance state of the MTJ memory element at the first sensing voltage; and further decreasing the cell voltage to a second sensing voltage and measuring a second sensing current, the selector element being nominally conductive if the MTJ memory element is in the low resistance state or nominally insulative if the MTJ memory element is in the high resistance state at the second sensing voltage.

12 Claims, 10 Drawing Sheets

METHOD FOR SENSING MEMORY ELEMENT COUPLED TO SELECTOR DEVICE

BACKGROUND

The present invention relates to a method for using a memory device, and more particularly, to embodiments of a method for sensing the resistance state of a memory cell that includes a memory element coupled to a selector element in series.

Spin transfer torque magnetic random access memory (STT-MRAM) is a new class of non-volatile memory, which can retain the stored information when powered off. An STT-MRAM device normally comprises an array of memory cells, each of which includes a magnetic memory element and a selection transistor coupled in series between appropriate electrodes. Upon application of a switching current through the magnetic memory element, the electrical resistance of the magnetic memory element would change accordingly, thereby switching the stored logic in the respective memory cell.

Figure 1:
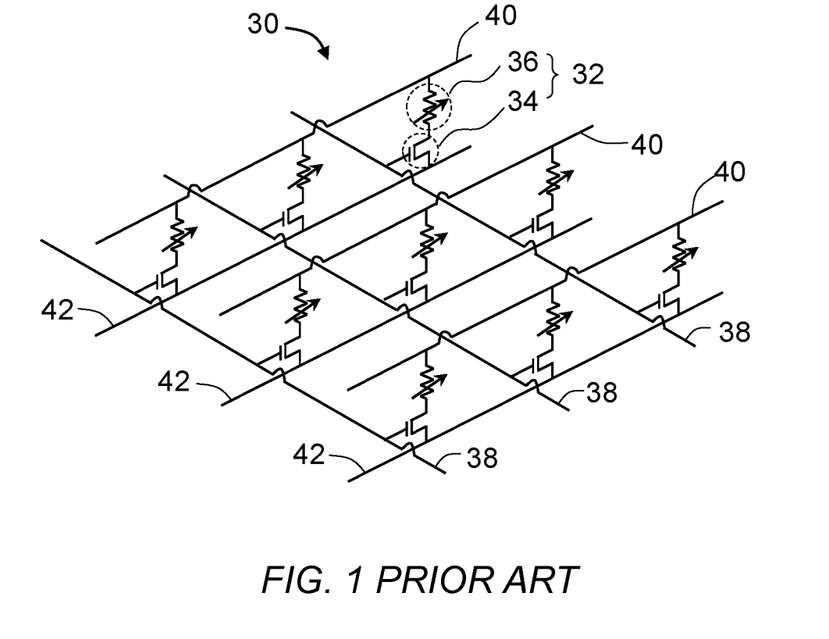
FIG. 1 is a schematic circuit diagram for a conventional STT-MRAM device.

FIG. 1 is a schematic circuit diagram of an STT-MRAM device 30, which comprises a plurality of memory cells 32 with each of the memory cells 32 including a selection transistor 34 coupled to a magnetic memory element 36; a plurality of parallel word lines 38 with each being coupled to the gates of a respective row of the selection transistors 34 in a first direction; and a plurality of parallel bit lines 40 with each being coupled to a respective row of the memory elements 36 in a second direction substantially perpendicular to the first direction; and a plurality of parallel source lines 42 with each being coupled to a respective row of the selection transistors 34 in the first or second direction.

The magnetic memory element 36 normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

STT-MRAM devices have almost unlimited read/write endurance but relatively smaller sensing margin compared with other types of resistance-based memory devices, such as phase change random access memory (PCRAM) and resistive random access memory (ReRAM). The resistance ratio of high-to-low resistance state of STT-MRAM is about 2-3, compared with $10^2$-$10^5$ for PCRAM and ReRAM. Therefore, there is a need for an STT-MRAM device that has an improved resistance ratio to increase the sensing margin and that can be inexpensively manufactured.

SUMMARY

The present invention is directed to a method for sensing the resistance state of a magnetic memory cell that satisfies this need. The magnetic memory cell includes a magnetic tunnel junction (MTJ) memory element coupled to a two-terminal selector element in series. The MTJ memory element has a high resistance state and a low resistance state. The two-terminal selector element has an on-state that is substantially conductive and an off-state that is substantially insulative. The method having features of the present invention includes the steps of turning on the selector element by raising a cell voltage across the magnetic memory cell above a threshold voltage for the selector element to become conductive; decreasing the cell voltage to a sensing voltage to sense the resistance state of the magnetic memory cell; and measuring a sensing current at the sensing voltage and comparing the sensing current to a reference value to determine the resistance state of the magnetic memory cell. At the sensing voltage, the two-terminal selector element is in the on-state if the MTJ memory element is in the low resistance state, or the two-terminal selector element is in the off-state if the MTJ memory element is in the high resistance state.

According to another aspect of the present invention, a method for sensing the resistance state of a magnetic memory cell that includes a magnetic tunnel junction (MTJ) memory element coupled to a two-terminal selector element in series includes the steps of: turning on the selector element by raising a cell voltage across the magnetic memory cell above a threshold voltage for the selector element to become conductive; decreasing the cell voltage to a first sensing voltage and measuring a first sensing current passing through the magnetic memory cell, the two-terminal selector element being nominally conductive irrespective of the resistance state of the MTJ memory element at the first sensing voltage; further decreasing the cell voltage to a second sensing voltage and measuring a second sensing current passing through the magnetic memory cell, the two-terminal selector element being nominally conductive if the MTJ memory element is in the low resistance state or nominally insulative if the MTJ memory element is in the high resistance state at the second sensing voltage; calculating the slope between a first point defined by the first sensing voltage and current and a second point defined by the second sensing voltage and current; comparing the slope to a reference slope value; concluding the magnetic memory cell is in a high resistance state if the slope is greater than the reference slope value; and concluding the magnetic memory cell is in a low resistance state if the slope is less than the reference slope value.

According to still another aspect of the present invention, a method for sensing the resistance state of a magnetic memory cell that includes a magnetic tunnel junction (MTJ) memory element coupled to a two-terminal selector element in series includes the steps of: turning on the selector element by raising a cell voltage across the magnetic memory cell above a threshold voltage for the selector element to become conductive; decreasing the cell voltage to a first sensing voltage and measuring a first sensing current passing through the magnetic memory cell, the two-terminal selector element being nominally conductive irrespective of the resistance state of the MTJ memory element at the first sensing voltage; further decreasing the cell voltage to a second sensing voltage and measuring a second sensing current passing through the magnetic memory cell, the two-terminal selector element being nominally conductive if the MTJ memory element is in the low resistance state or nominally insulative if the MTJ memory element is in the high resistance state at the second sensing voltage; calculating the difference between the first sensing current and the second sensing current; comparing the difference to a reference value; concluding the magnetic memory cell is in a high resistance state if the difference is greater than the reference value; and concluding the magnetic memory cell is in a low resistance state if the difference is less than the reference value.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 2:
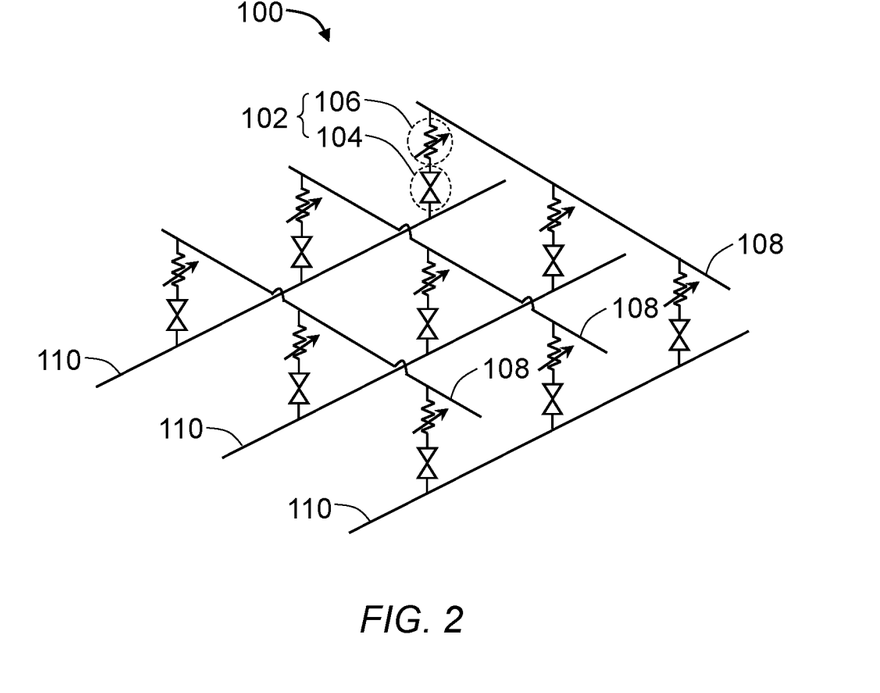
FIG. 2 is a schematic circuit diagram for an exemplary STT-MRAM device that can be used with method embodiments of the present invention.

FIG. 2 is a schematic circuit diagram of an exemplary STT-MRAM device that can be used with the method of the present invention. The MRAM device 100 comprises a plurality of memory cells 102 with each of the memory cells 102 including a bi-directional two-terminal selector element 104 coupled to an MTJ memory element 106 in series; a first plurality of parallel wiring lines 108 with each being coupled to a respective row of the MTJ memory elements 106 in a first direction; and a second plurality of parallel wiring lines 110 with each being coupled to a respective row of the selection elements 104 in a second direction substantially perpendicular to the first direction. Accordingly, the memory cells 102 are located at the cross points between the first and second plurality of wiring lines 108 and 110.

Figure 3:
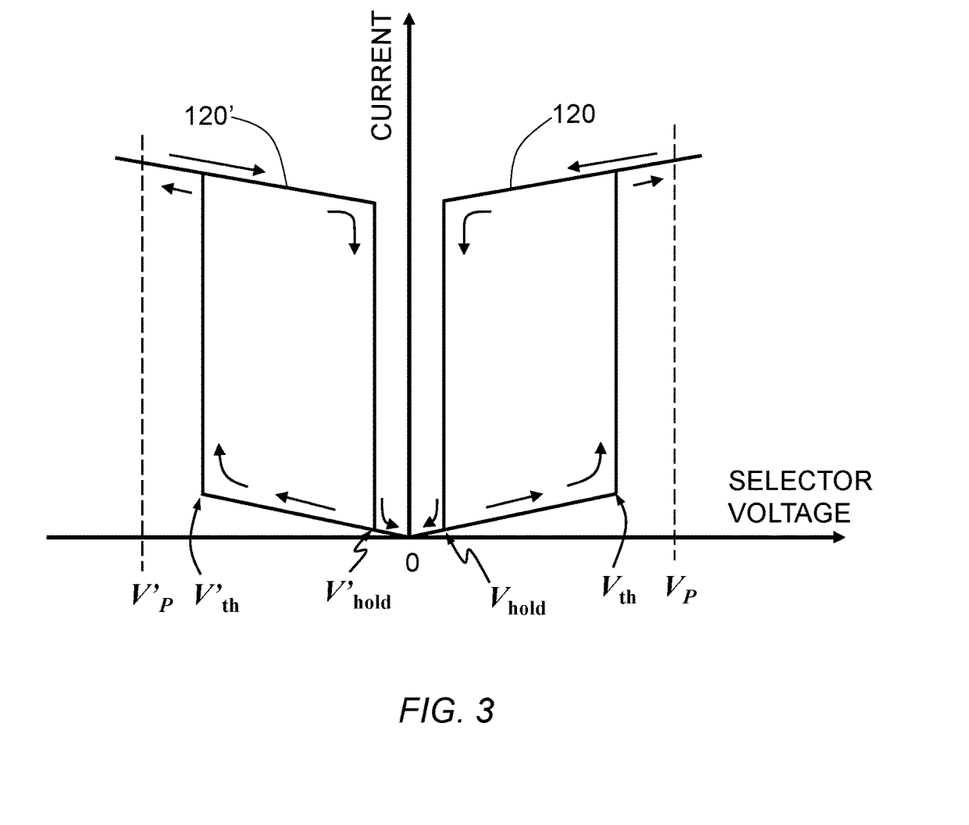
FIG. 3 shows an exemplary I-V response plot for a two-terminal selector element that can be used with method embodiments of the present invention.

FIG. 3 shows an exemplary current-voltage (I-V) response plot for the two-terminal selector element 104 by itself, without an external load (e.g., memory element) coupled thereto. The I-V response curve 120 shows the magnitude of electric current passing through the two-terminal selector element 104 as the voltage applied thereto varies. Initially, the current slightly increases with the applied voltage from zero to near a threshold voltage, $V_{th}$. At or near $V_{th}$, the current rapidly increases and exhibits a highly non-linear exponential behavior, indicating a transition of the selector element 104 from a nominally insulative state to a nominally conductive state. As the voltage continues to increase beyond $V_{th}$, the current increase becomes gradual until reaching $V_p$, which may be the programming voltage for the whole memory cell 102 when the memory element 106 is coupled to the selector element 104. The current response behaves like a step function as the applied voltage increases from zero to $V_p$ with the sharp increase occurring at or near $V_{th}$, which may be about 60-80% of $V_p$ in order to minimize current leakage.

With continuing reference to FIG. 3, as the voltage of the selector element 104 decreases from $V_p$ to near a holding voltage, $V_{hold}$, which is lower than $V_{th}$, the current gradually decreases and the selector element 104 remains in the highly conductive state. At or near $V_{hold}$, the current rapidly decreases and exhibits a highly non-linear behavior, indicating a transition from the nominally conductive state back to the nominally insulative state. As the voltage continues to decrease beyond $V_{hold}$, the current flow slightly decreases until stopping at about 0 V.

The I-V response curve 120 of the selector element 104 therefore behaves like a hysteresis loop. The nominally insulating selector element 104 turns on or becomes conductive when the applied voltage exceeds $V_{th}$. Once in the conductive state, the selector element 104 will stay on or remain conductive until the applied voltage dropping below $V_{hold}$, which is less than $V_{th}$. In a conventional write or programming operation, the selector element 104 is first turned on by raising the selector voltage to about $V_{th}$. The selector voltage is then further increased to a higher level $V_p$ that is sufficient to switch the resistance state of the memory element 106. In a conventional read or sensing operation, the selector element 104 is first turned on by raising the selector voltage to about $V_{th}$. The selector voltage is then decreased to a level between $V_{th}$ and $V_{hold}$ to minimize "read disturbance" and to ensure that the selector element 104 remains conductive to allow a sensing current to pass therethrough for determining the resistance state of the memory element 106.

The two-terminal selector element 104 is bi-directional as the polarity of the voltage may be reversed from zero to $V'_p$ as illustrated in the I-V plot of FIG. 3. The I-V response curve 120' corresponding to the opposite polarity may be substantially similar to that described above. Although FIG. 3 shows the I-V response curves 120 and 120' being substantially symmetric with respect to the current (vertical) axis, the present invention may be practiced even if the I-V response curves 120 and 120' of the selector element 104 are asymmetric (i.e. $|V_{th}| \neq |V'_{th}|$ and/or $|V_{hold}| \neq |V'_{hold}|$).

Figure 4A:
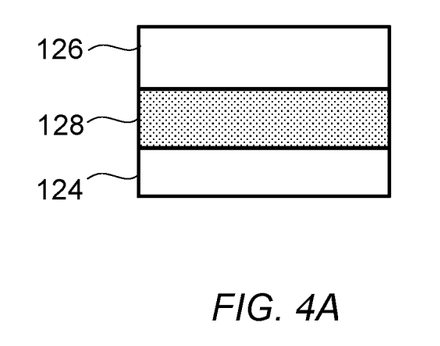
FIGS. 4A and 4B are cross sectional views of the two-terminal selector element exhibiting the I-V response of FIG. 3 and a switching layer therein, respectively.

The selector element 104 can be made of any two-terminal selector device known in the art or to be developed in the future. The selector element 104 may include a first electrode 124 and a second electrode 126 with a switching layer 128 interposed therebetween as illustrated in FIG. 4A. Each of the first and second electrodes 124 and 126 may be made of any suitable conductor, such as but not limited to Cu, $CuGe_x$, Ni, Ag, Pt, Pd, Cr, Co, Fe, Al, Au, Ir, Ru, Ti, $TiN_x$, Ta, $TaN_x$, W, $WN_x$, Mo, $MoN_x$, Zr, $ZrN_x$, Hf, $HfN_x$, Nb, $NbN_x$, or any combination thereof. In an embodiment, the first and second electrodes 124 and 126 are made of a same material. In an alternative embodiment, the first and second electrodes 124 and 126 are made of different materials.

Figure 4B:
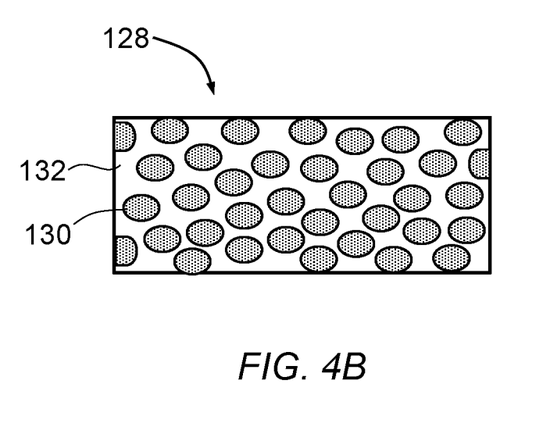

The switching layer 128 may be made of any suitable material that switches its resistance in the presence of an applied field or current, such as but not limited to $CuGe_xS_y$, $CuAg_xGe_yS_z$, $GeSb_xTe_y$, $AgIn_xSb_yTe_z$, $GeTe_x$, $SbTe_x$, $GeSb_x$, $VO_x$, $NiO_x$, $TiO_x$, $CrO_x$, $SrTi_xO_y$, or any combination thereof. The nominally insulating switching layer 128 may further include one or more metallic dopants, such as but not limited to Ag, Au, Zn, and Cu. Alternatively, the switching layer 128 may comprise a plurality of metal-rich clusters 130 embedded in a nominally semi-conducting or insulating matrix 132 as illustrated in FIG. 4B. The matrix 132 of the switching layer 128 may be made of a suitable stoichiometric or near-stoichiometric insulator compound, or a suitable non-stoichiometric insulator compound, or a suitable chalcogenide, or a suitable solid electrolyte, or any combination thereof. Examples of the suitable stoichiometric or near-stoichiometric insulator compound include silicon oxide ($SiO_2$), silicon nitride ($Si_3N_4$), aluminum oxide ($Al_2O_3$), magnesium oxide (MgO), tantalum oxide ($Ta_2O_5$), vanadium oxide ($V_2O_5$), niobium oxide ($Nb_2O_5$), titanium oxide ($TiO_2$), tungsten oxide ($WO_3$), hafnium oxide ($HfO_2$), zirconium oxide ($ZrO_2$), nickel oxides (NiO, $Ni_2O_3$), iron oxide ($Fe_2O_3$), yttrium oxide ($Y_2O_3$), europium oxide ($Eu_2O_3$), and any combinations thereof. Examples of the suitable non-stoichiometric oxide include $SiO_x$, $SiN_x$, $AlO_x$, $MgO_x$, $TaO_x$, $VO_x$, $NbO_x$, $TaO_x$, $TiO_x$, WO, $HfO_x$, $ZrO_x$, $NiO_x$, $FeO_x$, $YO_x$, $EuO_x$, and any combinations thereof. Examples of the suitable chalcogenide include GeTe, $Sb_2Te_3$, GeSb, $Ge_2Sb_2Te_5$, $GeSbTe_2$, $Sb_3Te_7$, and any combinations thereof. The suitable solid electrolyte for the matrix 132 may comprise one or more of the following elements: Ge, Sb, S, Se, In, Ga, Sn, As, and Te.

With continuing reference to FIG. 4B, the plurality of metal-rich clusters 130 may be made of a noble metal, or an alloy including one or more noble metals, or a fast electric field enhanced diffuser material, or any combination thereof. Examples of the noble metal include gold (Au), silver (Ag), platinum (Pt), palladium (Pd), rhodium (Rh), iridium (Ir), ruthenium (Ru), osmium (Os), and rhenium (Re). Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), titanium nitride (TiN), zirconium nitride (ZrN), tantalum nitride (TaN), niobium nitride (NbN), and tungsten nitride (WN). In an embodiment, the plurality of metal-rich clusters 130 are made of a same material as at least one of the first and second electrodes 124 and 126.

Figure 5:
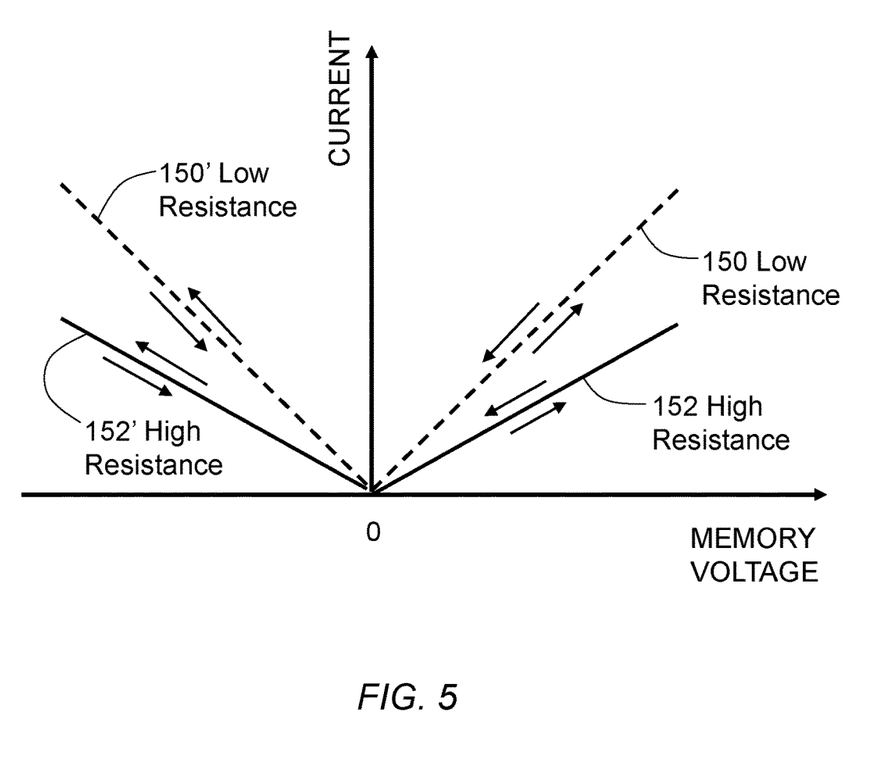
FIG. 5 shows an exemplary I-V response plot for an MTJ memory element that can be used with method embodiments of the present invention.

FIG. 5 shows an exemplary current-voltage (I-V) response plot for the MTJ memory element 106 in different resistance states. The I-V response curves 150 and 152 correspond to a low resistance state and a high resistance state of the MTJ memory element 106, respectively. The I-V response curves 150 and 152 show the current mostly varies with the memory voltage in a linear manner below switching voltage. In other words, the resistance of the MTJ memory element 106, which is defined by the inverse of the slope, remains relatively constant in a given resistance state or regime. The I-V response curves 150' and 152' corresponding to the opposite polarity is substantially similar to the curves 150 and 152, respectively. The MTJ memory element 106 may have a resistance ratio, which is defined as the resistance of the high friction state divided by the resistance of the low friction state, between about 1.5 and about 100, preferably between about 1.5 and about 10, more preferably between about 1.5 and about 5, even more preferably between about 2 and about 4.

Figure 6A:
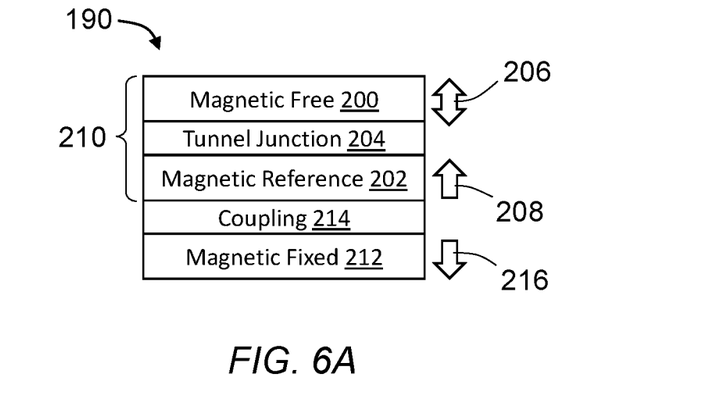
FIGS. 6A and 6B are cross sectional views of two exemplary structures for the MTJ memory element exhibiting the I-V response of FIG. 5.

The MTJ memory element 106 can be made of any suitable tunneling magnetoresistive device known in the art or to be developed in the future. FIG. 6A shows an exemplary structure 190 for the MTJ memory element 106 that includes a magnetic free layer 200 and a magnetic reference layer 202 with a tunnel junction layer 204 interposed therebetween. The magnetic free layer 200 has a variable magnetization direction 206 substantially perpendicular to the layer plane thereof. The magnetic reference layer 202 has a fixed magnetization direction 208 substantially perpendicular to the layer plane thereof. The magnetic free layer 200, the tunnel junction layer 204, and the magnetic reference layer 202 collectively form a magnetic tunnel junction 210. The exemplary structure 190 may further include a magnetic fixed layer 212 coupled to the magnetic reference layer 202 by an anti-ferromagnetic coupling layer 214. The magnetic fixed layer 212 has a second fixed magnetization direction 216 that is substantially perpendicular to the layer plane thereof and is substantially opposite to the first magnetization direction 208 of the magnetic reference layer 202.

Figure 6B:
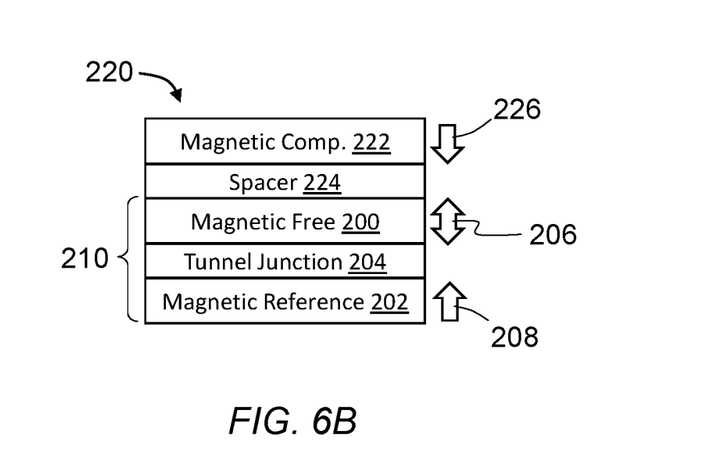

Another exemplary structure 220 for the MTJ memory element 106, as illustrated in FIG. 6B, includes the magnetic tunnel junction 210 and a magnetic compensation layer 222 separated from the magnetic free layer 200 by a non-magnetic spacer layer 224. The magnetic compensation layer 222 has a third fixed magnetization direction 226 that is perpendicular to the layer plane thereof and is substantially opposite to the first magnetization direction 208 of the magnetic reference layer 202.

The magnetic free layer 200, the magnetic reference layer 202, the magnetic fixed layer 212, and the magnetic compensation layer 222 of the above structures 190 and 220 may be made of any suitable magnetic material or structure. One or more of the magnetic layers 200, 202, 212, and 222 may comprise at least one ferromagnetic element, such as but not limited to cobalt (Co), nickel (Ni), or iron (Fe), to form a suitable magnetic material, such as but not limited to Co, Ni, Fe, CoNi, CoFe, NiFe, or CoNiFe. The magnetic material of the one or more of the magnetic layers 200, 202, 212, and 222 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), or phosphorus (P), to form a magnetic alloy or compound, such as but not limited to cobalt-iron-boron (CoFeB), iron-platinum (FePt), cobalt-platinum (CoPt), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), or cobalt-iron-phosphorous (CoFeP).

Some of the above-mentioned magnetic materials, such as Fe, CoFe, CoFeB may have a body-centered cubic (BCC) lattice structure that is compatible with the halite-like cubic lattice structure of MgO, which may be used as the insulating tunnel junction layer 126. CoFeB alloy used for one or more of the magnetic layers 200, 202, 212, and 222 may contain more than 40 atomic percent Fe or may contain less than 30 atomic percent B or both.

One or more of the magnetic layers 200, 202, 212, and 222 may alternatively have a multilayer structure formed by interleaving layers of a first type of material with layers of a second type of material with at least one of the two types of materials being magnetic, such as but not limited to [Co/Pt], [Co/Pd], [Co/Pt(Pd)], [Co/Ni], [Co/Ir], [CoFe/Pt], [CoFe/Pd], [CoFe/Pt(Pd)], [CoFe/Ni], [CoFe/Ir], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 204. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Still alternatively, one or more of the magnetic layers 200, 202, 212, and 222 may comprise two, three, four, or more magnetic sublayers with each magnetic sublayer being made of any suitable magnetic material, including magnetic metal, alloy, compound, or multilayer structure as described in the preceding paragraphs above.

Figure 7A:
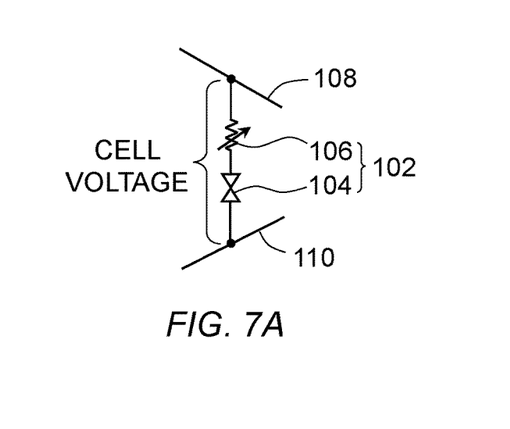
FIG. 7A is a schematic circuit diagram for a magnetic memory cell that can be used with method embodiments of the present invention.
Figure 7B:
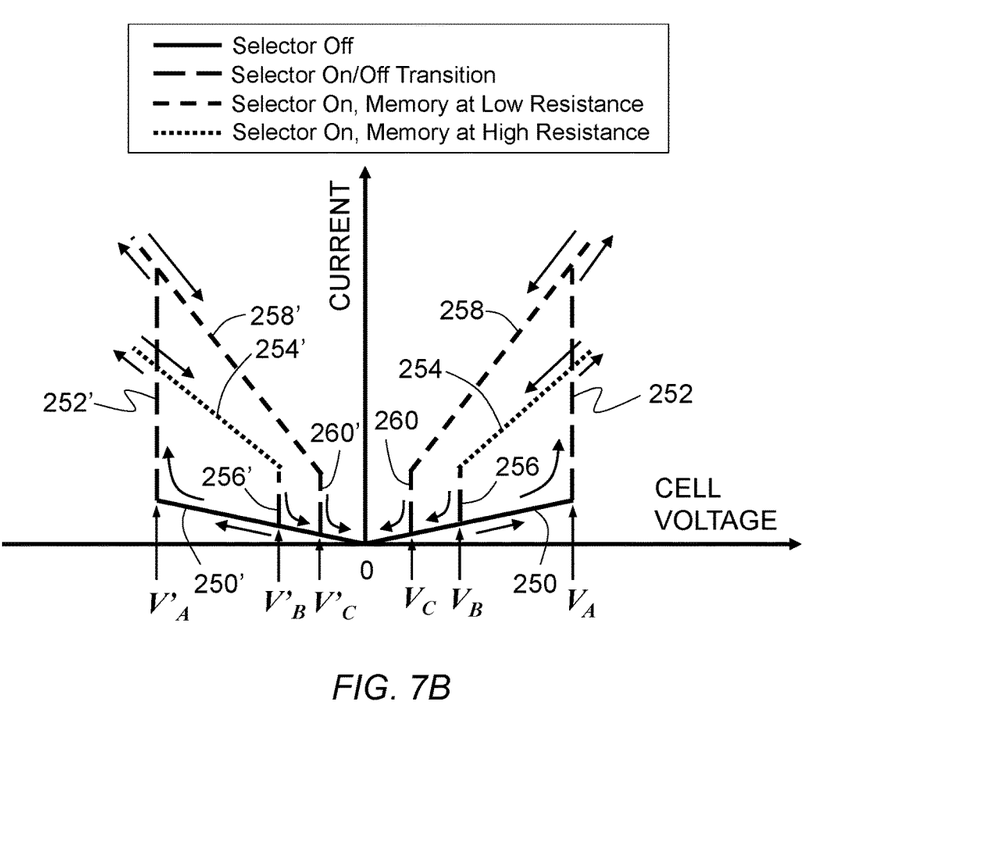
FIG. 7B shows an exemplary I-V response plot for the magnetic memory cell shown in FIG. 7A.

FIGS. 7A and 7B show a schematic diagram the memory cell 102, which includes the selector element 104 and the MTJ memory element 106 coupled in series, and the corresponding I-V response plot, respectively. The I-V response plot of FIG. 7B for the memory cell 102 may be formed by merging the I-V response plots of FIGS. 3 and 5 corresponding to the selector element 104 and the MTJ memory element, 106, respectively. As the cell voltage, which is the sum of the selector voltage and the memory voltage, increases to near a threshold voltage $V_A$, the current slightly increases and the selector element 104 remains substantially insulative or in the off-state, characterized by a curve 250. At or near the threshold voltage $V_A$, the current rapidly increases as the selector element 104 undergoes a transition from the nominally insulative state (off-state) to the nominally conductive state (on-state) characterized by a curve 252. The threshold voltage $V_A$ may be related to $V_{th}$ of FIG. 3. However, magnitude of $V_A$ may be larger because $V_A$ is essentially the sum of $V_{th}$ and the memory voltage.

With continuing reference to FIG. 7B, after the selector element 104 of the memory cell 102 is turned on at or near $V_A$, the I-V response will follow a curve 254 with further increase in the cell voltage beyond $V_A$ when the MTJ memory element 106 is in the high resistance state without switching the resistance state thereof. The curve 254 may be mostly governed by the high resistance behavior of the MTJ memory element 106 characterized by the curve 152 in FIG. 5. As the cell voltage decreases to near a holding voltage $V_B$, the current decreases, following the curve 254, while the selector element 104 remains in the on-state (conductive state). At or near the holding voltage $V_B$, the current rapidly decreases as characterized by a curve 256, indicating the transition of the selector element 106 from the on-state (conductive state) back to the off-state (insulative state). The holding voltage $V_B$ may be related to $V_{hold}$ of FIG. 3. However, magnitude of $V_B$ may be larger because $V_B$ is essentially the sum of $V_{hold}$ and the memory voltage when the MTJ memory element 106 is in the high resistance state. Further decrease in the cell voltage beyond $V_B$ causes the current to eventually reach zero at about 0 V while the selector element 104 remains in the nominally insulative state as depicted by the curve 250.

When the MTJ memory element 106 is in the low resistance state, the I-V response of the memory cell 102 will follow a curve 258 after the selector element 104 is turned on at or near $V_A$. With further increase in the cell voltage beyond $V_A$, the selector element 104 will remain in the on-state as the current increases. The curve 258 may be mostly governed by the low resistance behavior of the MTJ memory element 106 characterized by the curve 150 in FIG. 5. As the cell voltage decreases to near another holding voltage $V_C$, the current decreases, following the curve 258, while the selector element 104 remains in the nominally conductive state. At or near the holding voltage $V_C$, the current rapidly decreases as characterized by a curve 260, indicating the transition of the selector element 106 from the nominally conductive state back to the nominally insulative state. The holding voltage $V_C$ is essentially the sum of $V_{hold}$ of FIG. 3 and the memory voltage when the MTJ memory element 106 is in the low resistance state, resulting in $V_C$ being lower than $V_B$. Further decrease in the cell voltage beyond $V_C$ causes the current to eventually reach zero at about 0 V while the selector element 104 remains in the nominally insulative state as depicted by the curve 250.

The polarity of the applied voltage to the memory cell 102 may be reversed. When the memory element 106 is in the high resistance state, the I-V response may follow curves 250', 252', 254', 256', and back to curve 250' as the cell voltage increases from 0 V to a point beyond $V'_A$ and back. The insulative-to-conductive transition and the conductive-to-insulative transition occur at or near $V'_A$ and $V'_B$, respectively. When the memory element 106 is in the low resistance state, the I-V response may follow curves 250', 252', 258', 260', and back to curve 250' as the cell voltage increases from 0 V to a point beyond $V'_A$ and back. The insulative-to-conductive transition and the conductive-to-insulative transition occur at or near $V'_A$ and $V'_C$, respectively. Although FIG. 7B shows the I-V response plot of the memory cell 102 being substantially symmetric with respect to the current (vertical) axis, the present invention may be practiced even if the I-V response plot of the memory cell 102 is substantially asymmetric (i.e. $|V_A| \neq |V'_A|$ and/or $|V_B| \neq |V'_B|$ and/or $|V_C| \neq |V'_C|$).

The read or sensing operation of the memory cell 102 will now be discussed with reference to FIG. 8, which shows a portion of the I-V response plot of FIG. 7B as the cell voltage varies from 0 V to $V_A$ and beyond. In the read or sensing operation, the cell voltage is first raised to a level $V_T$ greater or equal to $V_A$ to turn on the selector element 104. The voltage $V_T$ may be chosen to be at a level that is greater than $V_A$ but less than the programming voltage $V_P$ to ensure the selector element 104 turns on while avoiding unintended writing or programming of the memory element 106. After the selector element 104 is initially turned on, the cell voltage is lowered to a level $V_{R1}$ to measure the sensing current passing through the memory cell 102. A high sensing current (Point E) at $V_{R1}$ as compared with a reference level means that the memory element 106 is in the low resistance state, while a low sensing current (Point F) at $V_{R1}$ as compared with the reference level means that the memory element 106 is in the high resistance state. To minimize "read disturbance" and power consumption while ensuring the selector element 104 remains conductive in the sensing operation, the sensing voltage $V_{R1}$ is normally chosen to be somewhere between $V_B$ and $V_A$.

Figure 8:
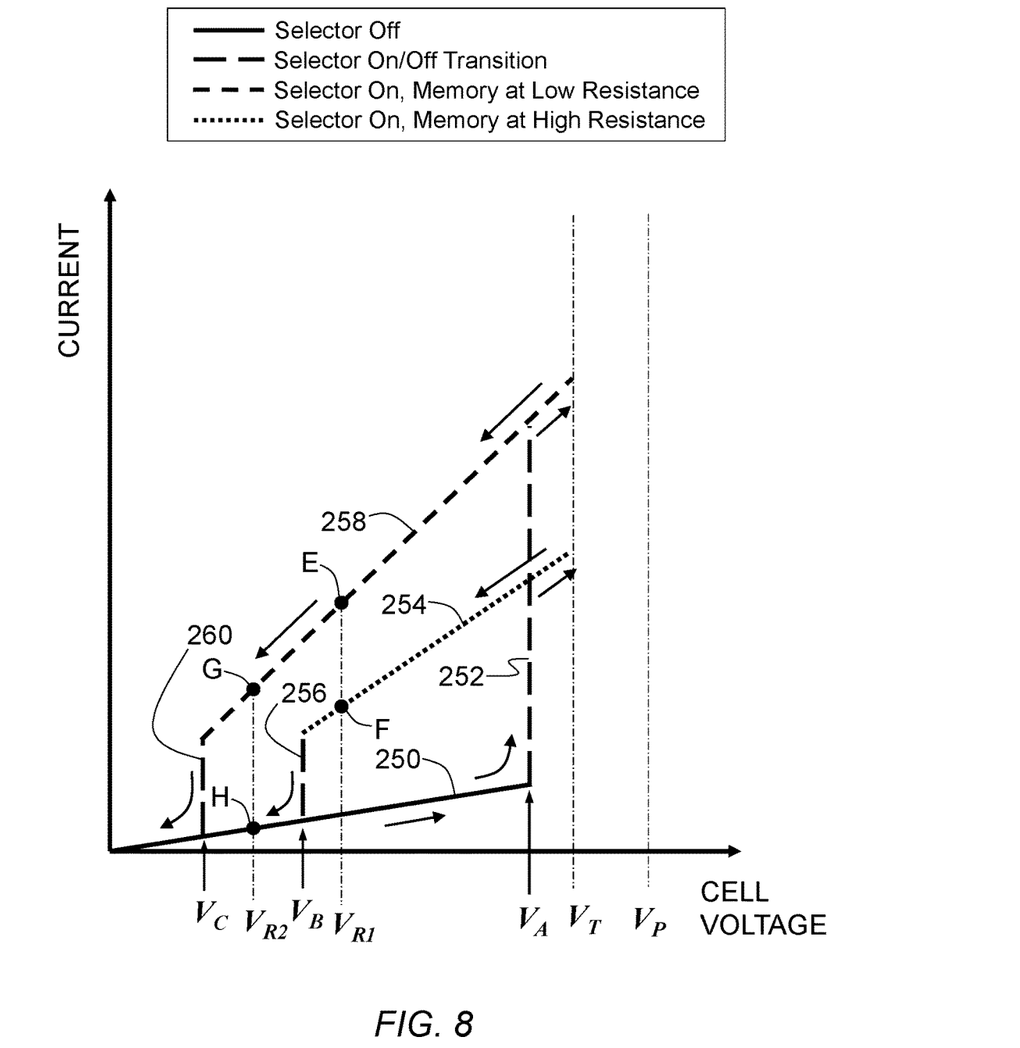
FIG. 8 shows a portion of the exemplary I-V response plot of FIG. 7B.

In an embodiment of the present invention as applied to a method for sensing the resistance state of the memory cell 102, the sensing voltage $V_{R2}$ is chosen to be between $V_C$ and $V_B$ as illustrated in FIG. 8. At the sensing voltage $V_{R2}$, the selector element 104 is in the on-state (conductive state) if the MTJ memory element 106 is in the low resistance state, or the selector element 104 is in the off-state (insulative state) if the MTJ memory element 106 is in the high resistance state. Because the selector element 104 is essentially insulative when the MTJ memory element 106 is in the high resistance state at the sensing voltage of $V_{R2}$, the difference between the high and low sensing currents or sensing margin at $V_{R2}$ will be significantly greater than the sensing margin at $V_{R1}$. For example, the selector element 104 may have on-state and off-state resistances of about 1 kΩ and $10^9$Ω, respectively, while the memory element 106 may have resistances of about 4 kΩ and 8 kΩ in the low and high resistance states, respectively. At the read or sensing voltage of $V_{R1}$, where the selector element 104 remains conductive irrespective of the resistance state of the memory element 106, the ratio of the sensing current at the low resistance state versus the sensing current at the high resistance state is about two or less. By contrast, at the sensing voltage of $V_{R2}$, where the selector element 104 remains nominally conductive when the memory element 106 is in the low resistance state or becomes nominally insulative when the memory element 106 is in the high resistance state, the same ratio of the sensing currents becomes about $2 \times 10^5$, which provides a five-orders of magnitude improvement in the sensing margin compared with the $V_{R1}$. A high sensing current (Point G) at $V_{R2}$ as compared with a reference level means that the memory element 106 is in the low resistance state, while a low sensing current (Point H) at $V_{R2}$ as compared with the reference level means that the memory element 106 is in the high resistance state.

Figure 9:
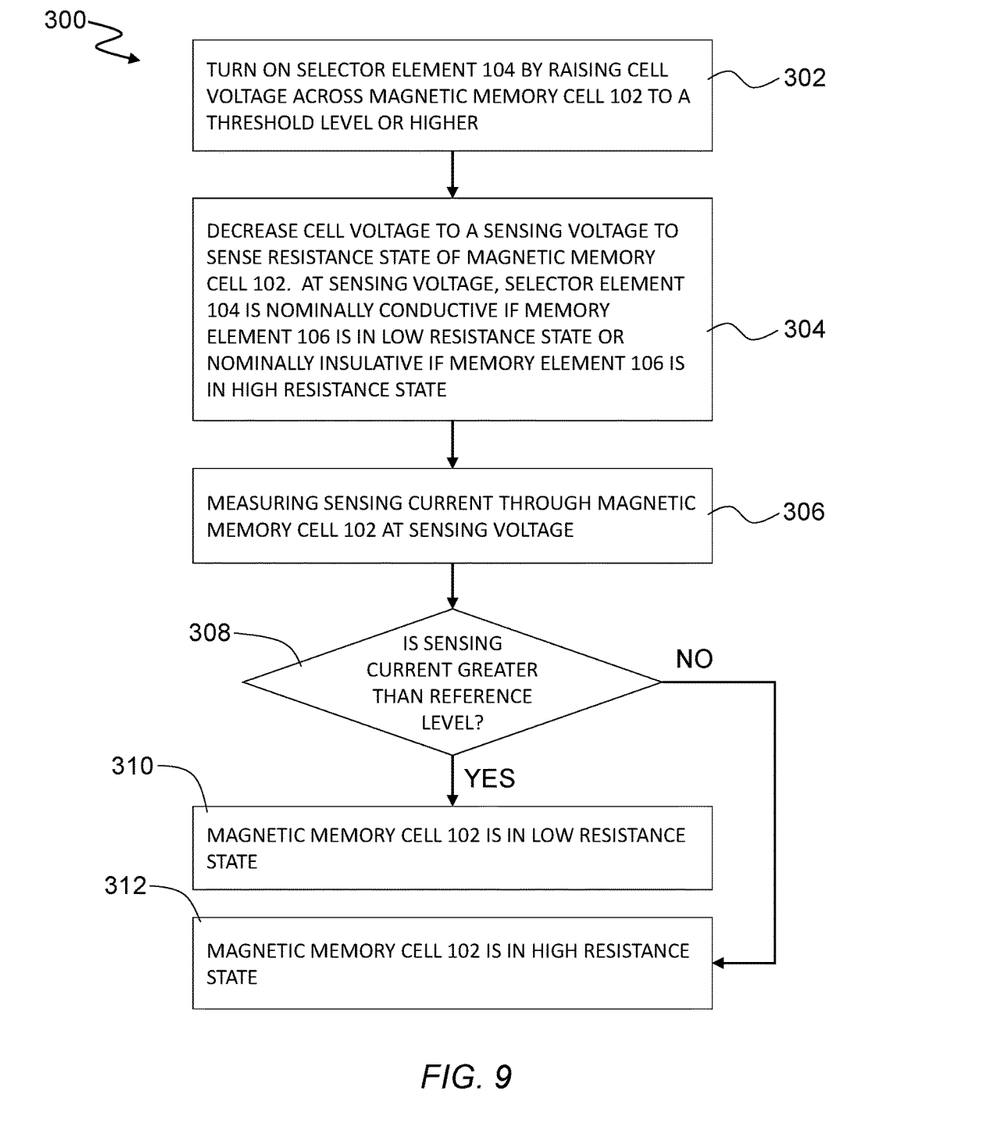
FIG. 9 is a flow chart illustrating selected steps of a method embodiment for sensing the resistance state of the memory cell exhibiting I-V behavior shown in FIG. 8.

A flow chart illustrating selected steps 300 for an exemplary method of sensing the resistance state of the memory cell 102 at the sensing voltage of $V_{R2}$ is illustrated in FIG. 9. The sensing steps 300 begin by turning on the selector element 104 at step 302 by raising the cell voltage across the memory cell 102 to a level (e.g. $V_T$) that is equal to or higher than the threshold voltage (e.g. $V_A$), at which the selector element 104 transitions from the nominally insulative state to the nominally conductive state. Next, at step 304, the cell voltage is decreased to a sensing voltage (e.g. $V_{R2}$) to sense the resistance state of the memory cell 102. At the sensing voltage, the selector element 104 is nominally conductive if the memory element 106 is in the low resistance state or is nominally insulative if the memory element 106 is in the high resistance state. At step 306, a sensing current through the memory cell 102 is measured at the sensing voltage. The sensing steps 300 proceed by comparing the measured sensing current to a reference level at step 308. If the sensing current is greater than the reference level, then the memory cell 102 is in the low resistance state as outlined at step 310. If not, then the memory cell 102 is in the high resistance state as outlined at step 312.

In another embodiment of the present invention as applied to a method for sensing the resistance state of the memory cell 102, the sensing current may be measured at multiple sensing voltages. At least one of the multiple sensing voltages is between $V_B$ and $V_A$ such that the selector element 104 remains nominally conductive (on-state) irrespective of the resistance state of the memory element 106 at the sensing voltage (e.g. $V_{R1}$). At least another one of the multiple sensing voltages is between $V_C$ and $V_B$ such that the selector element 104 is nominally conductive (on-state) if the memory element 106 is in the low resistance state or is nominally insulative (off-state) if the memory element 106 is in the high resistance state at the another sensing voltage (e.g. $V_{R2}$). The difference between the measured sensing currents at different sensing voltages may be compared to a reference level to determine the resistance state of the memory cell 102. If the difference between the measured sensing currents is greater than a reference level, then the memory cell 102 is in the high resistance state. If not, then the memory cell 102 is in the low resistance state. Alternatively, the slope (in the context of an I-V plot) between the points of sensing voltage/current may be compared to a reference slope level to determine the resistance state of the memory cell 102. If the slope is greater than a reference slope value, then the memory cell 102 is in the high resistance state. If not, then the memory cell 102 is in the low resistance state.

Figure 10:
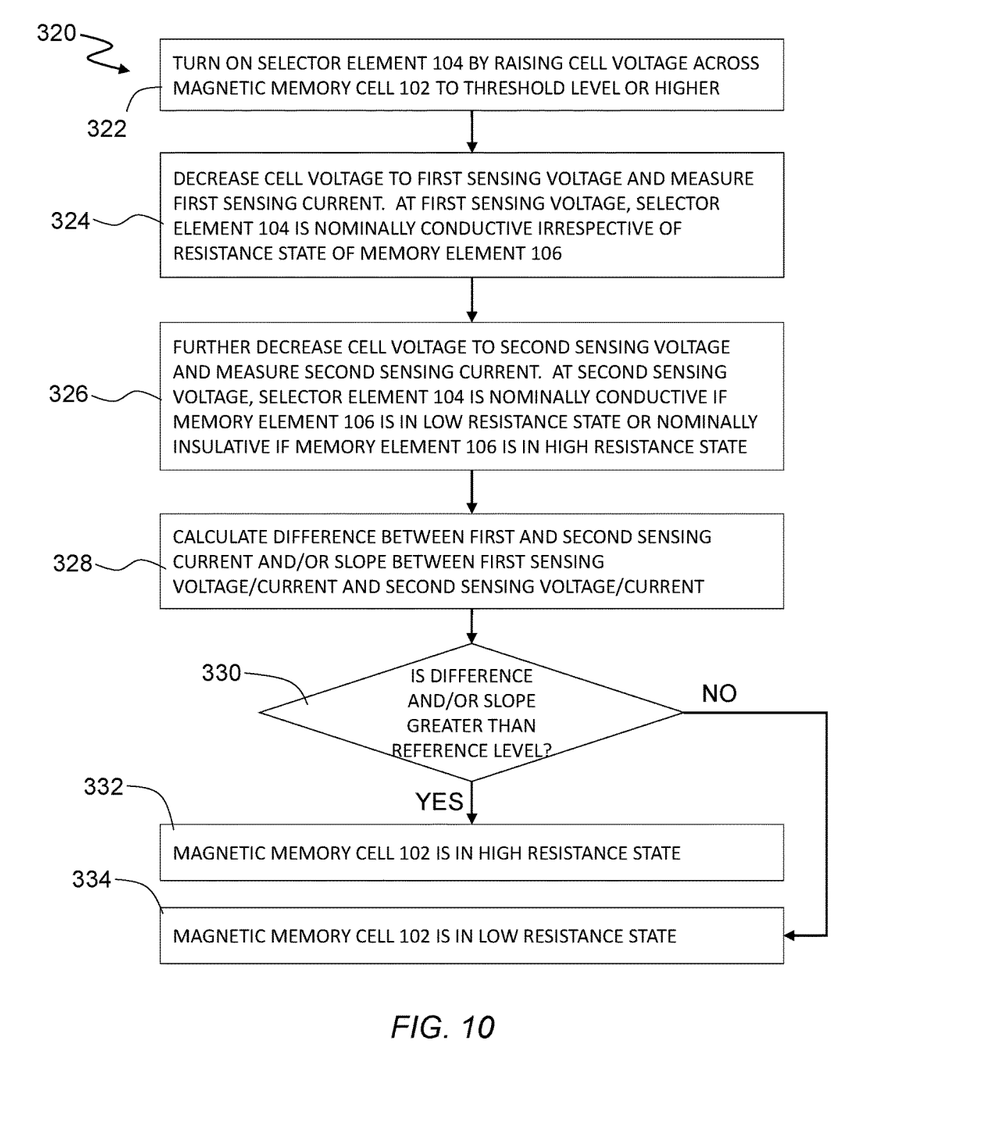
FIG. 10 is a flow chart illustrating selected steps of another method embodiment for sensing the resistance state of the memory cell exhibiting I-V behavior shown in FIG. 8.

FIG. 10 illustrates a flow chart of selected steps 320 for a method embodiment of sensing the resistance state of the memory cell 102 at two sensing voltages. The sensing steps 320 begin by turning on the selector element 104 at step 322 by raising the cell voltage across the memory cell 102 to a level (e.g. $V_T$) that is equal to or higher than the threshold voltage (e.g. $V_A$), at which the selector element 104 transitions from the nominally insulative state to the nominally conductive state. Next, at step 324, the cell voltage is decreased to a first sensing voltage (e.g. $V_{R1}$) to sense the resistance state of the memory cell 102 by measuring a first sensing current passing through the memory cell 102. At the first sensing voltage, the selector element 104 is nominally conductive irrespective of the resistance state of the memory element 106. After the measurement of the first sensing current at the first sensing voltage at step 324, the cell voltage is further decreased to a second sensing voltage (e.g. $V_{R2}$) to sense the resistance state of the memory cell 102 by measuring a second sensing current passing therethrough at step 326. At the second sensing voltage, the selector element 104 is nominally conductive if the memory element 106 is in the low resistance state or is nominally insulative if the memory element 106 is in the high resistance state. Next, at step 328, the difference between the first and second sensing currents is calculated and/or the slope (in the context of an I-V plot) between the first point defined by the first sensing voltage/current and the second point defined by the second sensing voltage/current is calculated. The sensing steps 320 proceed by comparing the difference between the first and second currents and/or the slope between two measured points to a reference level and/or slope at step 330. If the difference is greater than the reference level and/or the slope is greater than the reference slope, then the memory cell 102 is in the low resistance state as outlined at step 332. If not, then the memory cell 102 is in the high resistance state as outlined at step 334. It should be noted that the present invention may alternatively be practiced by measuring the second sensing current at the second voltage and then measuring the first sensing current at the first voltage, which is higher than the second voltage (i.e. reversing the order of steps 324 and 326).

With continuing reference to FIG. 8, the sense current may be measured at multiple points between $V_{R1}$ and $V_{R2}$ to reveal either a portion of curve 258 between points G and E or curve 256 and portions of curves 254 and 250 between points H and F. If the sensing current shows continuous decrease without an abrupt change between $V_{R1}$ and $V_{R2}$, then the memory cell 102 is in the low friction state. On the other hand, if the sensing current shows an abrupt change somewhere (e.g. $V_B$) between $V_{R1}$ and $V_{R2}$, then the memory cell 102 is in the high friction state.

It should be noted that the present invention may be applied to other types of non-volatile memories besides MRAM, such as but not limited to resistive random access memory (ReRAM) and phase change random access memory (PCRAM) that utilize two-terminal selector element. Accordingly, the memory element 106 of FIGS. 2 and 7A may comprise a phase change chalcogenide compound, such as but not limited to $Ge_2Sb_2Te_5$ or AgInSbTe, which can switch between a resistive phase and a conductive phase. Alternatively, the memory element 106 may comprise a nominally insulating metal oxide material, such as but not limited to $NiO$, $TiO_2$, $Ta_2O_5$, $HfO_2$, or $Sr(Zr)TiO_3$, which can switch to a lower electrical resistance state as the metal rich precipitates grow and link to form conductive paths upon application of an appropriate voltage.

The previously described embodiments of the present invention have many advantages, including low power consumption and high sensing margin. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A method for sensing a resistance state of a magnetic tunnel junction (MTJ) memory element in a magnetic memory cell that further includes a two-terminal selector element coupled to the MTJ memory element in series, the MTJ memory element having a high resistance mode and a low resistance mode, the two-terminal selector element having an on-state that is conductive and an off-state that is insulative, the method comprising the steps of:

turning on the selector element by raising a cell voltage across the magnetic memory cell above a threshold voltage for the selector element to become conductive;

decreasing the cell voltage to a first sensing voltage and measuring a first sensing current passing through the magnetic memory cell, the two-terminal selector element being conductive irrespective of the resistance state of the MTJ memory element at the first sensing voltage; and     further decreasing the cell voltage to a second sensing voltage and measuring a second sensing current passing through the magnetic memory cell, the two-terminal selector element being conductive if the MTJ memory element is in the low resistance mode or insulative if the MTJ memory element is in the high resistance mode at the second sensing voltage, calculating a difference between the first sensing current and the second sensing current;

comparing the difference to a reference value;

concluding the MTJ memory element is in the high resistance mode if the difference is greater than the reference value; and     concluding the MTJ memory element is in the low resistance mode if the difference is less than the reference value.

2. A method for sensing a resistance state of a magnetic tunnel junction (MTJ) memory element in a magnetic memory cell that further includes a two-terminal selector element coupled to the MTJ memory element in series, the MTJ memory element having a high resistance mode and a low resistance mode, the two-terminal selector element having an on-state that is conductive and an off-state that is insulative, the method comprising the steps of:

turning on the selector element by raising a cell voltage across the magnetic memory cell above a threshold voltage for the selector element to become conductive;

decreasing the cell voltage to a first sensing voltage and measuring a first sensing current passing through the magnetic memory cell, the two-terminal selector element being conductive irrespective of the resistance state of the MTJ memory element at the first sensing voltage; and further decreasing the cell voltage to a second sensing voltage and measuring a second sensing current passing through the magnetic memory cell, the two-terminal selector element being conductive if the MTJ memory element is in the low resistance mode or insulative if the MTJ memory element is in the high resistance mode at the second sensing voltage, calculating a slope between a first point defined by the first sensing voltage and the first sensing current and a second point defined by the second sensing voltage and the second sensing current;

comparing the slope to a reference slope value;

concluding the MTJ memory element is in the high resistance mode if the slope is greater than the reference slope value; and concluding the MTJ memory element is in the low resistance mode if the slope is less than the reference slope value.

3. The method claim 1, further comprising the step of measuring a third sensing current at a third sensing voltage between the first and second sensing voltages.

4. The method claim 1, further comprising the steps of measuring multiple sensing currents at multiple sensing voltage between the first and second sensing voltages.

5. The method of claim 1, wherein a resistance ratio of the high resistance mode to the low resistance mode of the MTJ memory element is between 2 to 4.

6. The method of claim 1, wherein a resistance ratio of the high resistance mode to the low resistance mode of the MTJ memory element is between 1.5 to 5.

7. The method of claim 1, wherein the MTJ memory element includes:

a magnetic free layer having a variable magnetization direction perpendicular to a layer plane thereof;

a magnetic reference layer having a first invariable magnetization direction perpendicular to a layer plane thereof;

a tunnel junction layer interposed between the magnetic free layer and the magnetic reference layer;

a magnetic fixed layer having a second invariable magnetization direction opposite to the first invariable magnetization direction; and an anti-ferromagnetic coupling layer interposed between the magnetic reference layer and the magnetic fixed layer.

8. The method claim 2, further comprising the step of measuring a third sensing current at a third sensing voltage between the first and second sensing voltages.

9. The method claim 2, further comprising the steps of measuring multiple sensing currents at multiple sensing voltage between the first and second sensing voltages.

10. The method of claim 2, wherein a resistance ratio of the high resistance mode to the low resistance mode of the MTJ memory element is between 2 to 4.

11. The method of claim 2, wherein a resistance ratio of the high resistance mode to the low resistance mode of the MTJ memory element is between 1.5 to 5.

12. The method of claim 2, wherein the MTJ memory element includes:

a magnetic free layer having a variable magnetization direction perpendicular to a layer plane thereof;

a magnetic reference layer having a first invariable magnetization direction perpendicular to a layer plane thereof;

a tunnel junction layer interposed between the magnetic free layer and the magnetic reference layer;

a magnetic fixed layer having a second invariable magnetization direction opposite to the first invariable magnetization direction; and an anti-ferromagnetic coupling layer interposed between the magnetic reference layer and the magnetic fixed layer.

* * * * *